United States Patent [19]

Platzer

[11] Patent Number: 5,236,806
[45] Date of Patent: Aug. 17, 1993

[54] PHOTOPOLYMERIZABLE, POSITIVE WORKING, PEEL DEVELOPABLE, SINGLE SHEET COLOR PROOFING SYSTEM

[75] Inventor: Stephan J. W. Platzer, Eltville, Fed. Rep. of Germany

[73] Assignee: Hoechst Celanese Corporation, Somerville, N.J.

[21] Appl. No.: 714,792

[22] Filed: Jun. 13, 1991

Related U.S. Application Data

[60] Division of Ser. No. 463,075, Jan. 10, 1990, Pat. No. 5,049,476, which is a continuation-in-part of Ser. No. 220,479, Jul. 18, 1988, Pat. No. 4,895,787.

[51] Int. Cl.$^5$ .............................................. G03C 1/805
[52] U.S. Cl. .................................. 430/253; 430/254; 430/271; 430/260
[58] Field of Search ............... 430/253, 254, 260, 288, 430/271

[56] References Cited

U.S. PATENT DOCUMENTS

| | | |
|---|---|---|
| 3,798,034 | 3/1974 | Laridon . |
| 4,157,261 | 6/1979 | Takeda . |
| 4,174,216 | 11/1979 | Cohen et al. . |
| 4,210,711 | 7/1988 | Kita jima et al. . |
| 4,247,619 | 1/1981 | Cohen et al. . |
| 4,282,308 | 8/1981 | Cohen et al. . |
| 4,284,703 | 8/1981 | Inoue et al. . |
| 4,304,836 | 12/1981 | Cheema et al. . |
| 4,304,838 | 12/1981 | Hasegawa et al. . |
| 4,304,839 | 12/1981 | Cohen et al. . |
| 4,316,951 | 2/1982 | Cohen et al. . |
| 4,356,251 | 10/1982 | Cohen et al. . |
| 4,357,413 | 11/1982 | Cohen et al. . |
| 4,458,003 | 7/1984 | Shepherd et al. . |
| 4,489,153 | 12/1984 | Ashcraft et al. . |
| 4,489,154 | 12/1984 | Taylor, Jr. . |
| 4,504,571 | 3/1985 | Yamamura et al. . |
| 4,596,757 | 6/1986 | Barton et al. . |
| 4,650,738 | 3/1987 | Platzer et al. . |
| 4,659,642 | 4/1987 | Platzer et al. . |
| 4,668,603 | 5/1987 | Taylor, Jr. . |
| 4,877,697 | 10/1989 | Vollmann et al. . |
| 4,895,787 | 1/1990 | Platzer . |
| 4,910,120 | 3/1990 | Platzer et al. . |
| 4,933,258 | 6/1990 | Shinozaki et al. . |
| 4,948,693 | 8/1990 | Shadrach et al. . |
| 4,999,266 | 3/1991 | Platzer . |
| 5,039,590 | 8/1991 | Platzer et al. ................ 430/254 |
| 5,049,476 | 9/1991 | Platzer ............................ 430/253 |

OTHER PUBLICATIONS

Edwin P. Plueddemann; "Silane Coupling Agents", Plenum Press, New York, 1982, pp. 4–5.
Encyclopedia of Polymer Science and Engineering, vol. 1 1985, "Adhesion & Bonding", pp. 480, 481, 490–493.
Encyclopedia of Polymer Science and Engineering, 2nd. Ed. vol. 12; "Polyester Films"; pp. 55, 56, 61, 209, 210, 216.

Primary Examiner—Marion E. McCamish
Assistant Examiner—Christopher D. RoDee
Attorney, Agent, or Firm—Andrew F. Sayko, Jr.

[57] ABSTRACT

This invention relates to positive working photopolymerizable sheet constructions which, upon exposure to an actinic radiation source through a screened image, can accurately reproduce said image. The construction is useful as a color proofing film which can be employed to accurately predict the image quality from a lithographic printing process.

31 Claims, No Drawings

PHOTOPOLYMERIZABLE, POSITIVE WORKING, PEEL DEVELOPABLE, SINGLE SHEET COLOR PROOFING SYSTEM

CROSS REFERENCE TO RELATED APPLICATION

This application is a divisional of U.S. patent application Ser. No. 07/463,075, filed Jan. 10, 1990, now U.S. Pat. No. 5,049,476, which was a continuation-in-part of U.S. patent application Ser. No. 07/220,479, now U.S. Pat. No. 4,895,787, filed Jul. 18, 1988 which is incorporated herein by reference.

BACKGROUND OF THE INVENTION

In the graphic arts, it is desirable to produce a three or more color proof to assist in correcting a set of color separation films prior to using them to produce printing plates. The proof should reproduce the color quality that will be obtained during the printing process. The proof must be a consistent duplicate of the desired halftone image. Visual examination of a color proof should show the color rendition to be expected from press printing using the color separations and any defects on the separations which might need to be altered before making the printing plates.

Color proofing sheets for multicolored printing can be made by using a printing press or proof press. This requires that all of the actual printing steps be performed. Therefore, this conventional method of color proofing is costly and time consuming.

Photoimaging processes can also be used to produce a color proof. There are two general types of photoimaging methods; namely the overlay type and the single sheet type.

In the overlay type of color proofing method, an independent transparent plastic support is used for producing an image of each color separation film by applying a photosensitive solution of the corresponding color. A plurality of such supports carrying images of the corresponding colors are then superimposed upon each other over a white sheet to produce a color proofing composite. The primary advantage of the overlay method is that proofs can be made quickly and can serve as a progressive proof by combining any two or three colors in register. However, this type of color proofing method has the disadvantage that the superimposed plastic supports tend to darken the color proofing sheet. As a result, the impression of the color proofing composite thus prepared is vastly different from that of copies actually obtained with conventional printing presses and with proof presses. Examples of such overlay approaches are contained in U.S. Pat. Nos. 3,136,637; 3,211,553; and 3,326,682.

In the single sheet type of color proofing method, a color proofing sheet is prepared by successively producing images of different colors from different color separation films on a single receiver sheet. This can be accomplished by sequentially applying colorants or colored, photosensitive layers to a single opaque support. This method more closely resembles the actual printing process and eliminates the color distortion inherent in the overlay system. Examples of such single sheet approaches are contained in U.S. Pat. Nos. 3,671,236; 4,260,673; 4,366,223; 4,650,738; 4,656,114; and 4,659,642.

U.S. Pat. No. 3,574,049 provides a thermal transfer process for printing a design on a final support which comprises (a) printing a design onto a temporary support, (b) superimposing the temporary support and the final support, (c) applying heat and/or pressure to the superimposed structure formed in (b), and (d) separating the temporary support from the final support which retains the printed design. The affinity of the matter of the design towards the final support is greater than its affinity towards the temporary support. This process has the disadvantage of a printing step.

Various processes for producing single sheet color proofs of an image embodying thermal transfer and photopolymerization techniques are known, for example, from U.S. Pat. Nos. 3,060,023; 3,060,024; 3,060,025; 3,481,736; and 3,607,264. In these processes, a photopolymerizable layer coated on a suitable support is imagewise exposed through a color separation film. The surface of the exposed layer is then pressed into contact with an image receptive surface of a separate element. At least one of the said elements is heated to a temperature above the transfer temperature of the unexposed portions of the layer. The two elements are then separated, whereby the thermally transferrable, unexposed, image areas of the composite transfer to the image receptive element. If the element is not precolored, the tacky unexposed image may now be selectively colored with a desired toner. The colored matter preferentially adheres to the clear unpolymerized material.

In U.S. Pat. Nos. 3,721,557, a method for transferring colored images is claimed which provides a stripping layer coated between a photosensitive element and a support. When the photosensitive layer is exposed to actinic light and developed, the more soluble portions are selectively removed to produce a visible image. The image carrying support is pressed against a suitable adhesive coated receptor member and the carrier support is subsequently stripped to accomplish the transfer of the image. A fresh layer of adhesive must be applied to the receptor for each subsequent transfer.

U.S. Pat. Nos. 4,596,757 provides a method for transferring images or solid colors which are subsequently imaged. The photosensitive material comprises a carrier support having sequentially disposed thereon a release layer; a colored, photopolymerizable layer; and an adhesive layer. The material can undergo exposure, lamination to a temporary support, wet development, and then lamination to a receptor sheet. Alternatively, the photosensitive material can be laminated to a receptor sheet, undergo exposure, and then wet processed. Both processes require development in an aqueous medium.

In U.S. Pat. No. 4,489,154, a process is claimed which produces a single layer color proof without wet development. The photosensitive material comprises a strippable cover sheet; a colored photoadherent layer; a non-photosensitive organic contiguous layer; and a sheet support. The material is exposed and peel developed. The positive or negative image is transferred to a receiver base. A fresh layer of adhesive must be applied to the receptor for each subsequent transfer.

SUMMARY OF THE INVENTION

The present invention provides a positive-acting proofing method which comprises, in order:
(A) providing a photosensitive element which comprises, in order:
(i) a transparent support preferably having an adhesion promoted surface; and (ii) a single photosensitive composition layer on said preferably adhesion promoted surface, which photosensitive layer comprises an organic binding resin, a colorant, a photoinitiator, and a free radical polymerizable acrylate or methacrylate component having at least two ethylenically unsaturated groups, wherein said binding resin is present in sufficient amount to bind the composition components into a uniform film, and wherein said colorant is present in sufficient amount to uniformly color the composition, and wherein said photoinitiator is present in sufficient amount to initiate the free radical polymerization of said polymerizable component upon exposure to sufficient actinic radiation, and wherein said polymerizable component is present in sufficient amount to provide image differentiation when the composition is image-wise exposed to actinic radiation; and (iii) an adhesive layer directly adhered to said colored, photosensitive layer, which adhesive layer comprises a thermoplastic resin which has a $T_g$ in the range of from about 25° C. to about 100° C.; and (B) either (i) providing a receiver base to which said adhesive layer is laminated at elevated temperature and pressure; and then image-wise exposing said photosensitive composition through the transparent support to actinic radiation; or (ii) image-wise exposing said photosensitive composition to actinic radiation; and then providing a receiver base to which said adhesive layer is laminated at elevated temperature and pressure; and (C) peeling apart said support and said receiver base, thereby transferring the adhesive layer and the image-wise nonexposed portions of the colored, photosensitive composition to the receiver base while the image-wise exposed portions remain on the adhesion promoted surface of the support; and (D) optionally repeating steps (A) through (C) at least once with another photosensitive element having at least one different colorant transferred to the adhesive layer and image-wise nonexposed portions of the previously processed photosensitive element on said receiver base.

DETAILED DESCRIPTION OF THE PREFERRED EMBODIMENT

In the usual full color proofing guide, four distinct colored images are formed, namely magenta, cyan, yellow, and black. When the images are superimposed upon each other, a simulated full color reproduction results. As hereinbefore described, one begins the process of the present invention by preparing a photosensitive element which has a support and sequentially carried thereon a colored, photopolymerizable layer and then a thermoplastic adhesive layer.

In the preferred embodiment, the support may be composed of any suitable flexible sheet material provided it is transparent to the actinic radiation for the photopolymerizable layer. It should also preferably be dimensionally stable when treated with the herein specified processes. That is, it should have substantially no change in dimensions under heating in the range of approximately 60° C. to 120° C. during lamination. One preferred material is polyethylene terephthalate. In the usual case, it has a thickness of approximately 20 to 200 um and a more preferred thickness of approximately 50 to 80 um. The surface of the support may be smooth or it may be provided with a matte texture as on Melinex 475, which is available from ICI. A smooth surface is preferred because it does not scatter the actinic radiation and thereby does not reduce the resolution capability of the photosensitive layer. Suitable films with smooth surfaces nonexclusively include Melinex 054, 504, 505 and 582 available from ICI, and hostaphan 4400,4500, and 4540 available from Hoechst Celanese Corporation.

The preferred films are surface modified on one side or on both sides. Such modifications of the transparent support are preferred to increase the adhesion of the exposed areas of the photosensitive coating to the support. This results in an improved dot reproduction. Therefore, as defined within the context of this invention, an adhesion promoted surface is one wherein the surface has been modified to make it more receptive to the light exposed areas of the photosensitive coating. Such surface modifications include using a flame, electrical discharge, chemical etch, and surface coatings.

The surface coatings for adhesion promotion modify the surface without contributing any mechanical or optical film properties of their own. They are commonly incorporated during the manufacturing process of the support. They may be monomolecular thick but are generally several layers thick. The dried surface coatings are extremely thin, preferably between about 0.001 um and about 0.1 um, and therefore not self supporting. They are strongly bonded to the transparent support such that these surface coatings completely remain with the support during peel development. In other words, they are not partially nor wholly removed from the support during peel development. Examples of surface modifying coatings are disclosed in U.S. Pat. Nos. 3,751,280; 3,819,773; 4,066,820; 4,098,952; 4,391,767; 4,486,483; 4,493,872; and 4,515,863. The preferred surface coating is a crosslinked polymer or copolymer or acrylic acid or methacrylic acid or their esters with a thickness of about 0.003 um.

The adhesion promoter is by definition not an adhesive. An adhesive is defined for the purpose of this invention to be a material which flows and wets both surfaces of the elements to which it adheres and fills in the gaps of their surfaces under suitable conditions of temperature and pressure. An adhesion promoter may act in this manner when it is applied to one surface but does not flow to the other surface.

Coatings which are thicker than 0.1 um are not suitable for this application because thick coatings change the mechanical properties of the support and interfere with the optical clarity of the support. They may also absorb monomers from the photosensitive layer, cohesively fail during peel development, release from the support during peel development, and prevent good adhesion of subsequent adhesive layers.

The colored, photosensitive layer is applied from a solvent coating composition to the support, preferably to the adhesion promoted side of the support. Organic solvents are preferred for the photosensitive coating because of the diverse solubility characteristics of the various components. Typical solvents nonexclusively include methyl ethyl ketone, 2-methoxyethanol, 1-methoxy-2-propanol, 4-hydroxy-4-methyl-2-pentanone, tetrahydrofuran, and gamma-butyrolactone.

A typical photosensitive layer comprises a photopolymerizable monomer, photoinitiator, colorant, binder, and optional ingredients.

The photopolymerizable material contained in the colored, photosensitive layer preferably comprises an addition polymerizable, nongaseous (boiling temperature above 100° C. at normal atmospheric pressure), ethylenically unsaturated compounds containing at least two terminal ethylenically unsaturated groups, and being capable of forming a high molecular weight polymer by free radical initiated, chain propagating addition polymerization. Suitable polymerizable materials nonexclusively include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerythritol triacrylate, bisphenol A ethoxylate dimethacrylate, trimethylolpropane ethoxylate triacrylate, and trimethylolpropane propoxylate triacrylate.

Free radical liberating photoinitiators include any compound which liberate free radicals on stimulation by actinic radiation. Preferred photoinitiators nonexclusively include quinoxaline compounds as described in U.S. Pat. No. 3,765,898; the vicinal polyketaldonyl compounds in U.S. Pat. No. 2,367,660; the alpha-carbonyls in U.S. Pat. Nos. 2,367,661 and 2,367,670; the acyloin ethers in U.S. Pat. No. 2,448,828; the triarylimidazolyl dimers in U.S. Pat. No. 3,479,185; the alpha-hydrocarbon substituted aromatic acyloins in U.S. Pat. No. 2,722,512; polynuclear quinones in U.S. Pat. Nos. 2,951,758 and 3,046,127; and s-triazines in U.S. Pat. No. 4,656,272.

Dyes and/or pigments are included in the photosensitive layer to provide color to the image areas. Preferred colorants for this invention are pigments rather than dyes. Light fast colorants are preferred. The pigments are typically dispersed with an organic binder in an organic solvent or mixture of organic solvents. The pigments may be organic or inorganic. They are ground to a small enough particle size to duplicate the particle size and color of equivalent inks. The median diameter is generally less than 1 um.

Nonexclusive examples of colorants usable in the present invention are as follows: Permanent Yellow G (C.I. 21095), Permanent Yellow GR (C.I. 21100), Permanent Yellow DHG (C.I. 21090), Permanent Rubine L6B (C.I. 15850:1), Permanent Pink F3B (C.I. 12433), Hostaperm Pink E (73915), Hostaperm Red Violet ER (C.I. 46500), Permanent Carmine FBB (12485), Hostaperm Blue B2G (C.I. 74160), Hostaperm Blue A2R (C.I. 74160), and Printex 25. Most of these pigments are products of Hoechst AG. They can be used separately or blended for a desired color.

The photosensitive layer also contains a binder which not only determines the hardness and/or flexibility of the coating but is also used to control the dry development. For example, the colored layer will remain with its support in the exposed and nonexposed areas if the binder readily adheres to the adhesion promoted surface and if too much of this type of binder is used. If the binder readily releases from the surface and if too much of this type of binder is used, then the colored layer will be totally transferred with the adhesive layer.

Binders found suitable for the photosensitive layer are styrene/maleic anhydride copolymers and their half esters; acrylic polymers and copolymers; polyamides; polyvinyl pyrrolidones; cellulose and its derivatives; phenolic resins; and the like. The most preferred binders are polyvinyl acetals, such as polyvinyl butyral and polyvinyl propional. The most preferred binders are polyvinyl formals which are commercially available from Monsanto as Formvar. The formal content of the polyvinyl formals is approximately 65% to 86% expressed as percent polyvinyl formal. The acetate content is approximately 9% to 30% expressed as percent polyvinyl acetate. The hydroxyl content is approximately 5% to 7% as expressed as percent polyvinyl alcohol. The average molecular weight is between 10,000 and 40,000.

Dyes may be included to spectrally sensitize the photoinitiator, such as described in U.S. Pat. Nos. 4,282,309 and 4,454,218, and European Patent Applications 0,179,448 and 0,211,615.

Other ingredients which may be present in the photosensitive layer are thermal polymerization inhibitors, plasticizers, oligomers, residual solvents, surfactants, inert fillers, antihalation agents, hydrogen atom donors, photoactivators, and optical brightening agents.

In the preferred embodiment, the dry photosensitive layer has a coating weight range between approximately 0.1 and 5 $g/m^2$. The more preferred coating weight is between approximately 0.4 to 2 $g/m^2$.

In the practice of the present invention, the photopolymerizable monomer component is preferably present in the photosensitive layer in an amount ranging from approximately 10% to 60% based on the weight of the solids in the layer. A more preferred range is from approximately 15% to 40%.

In the practice of the present invention, the photoinitiator component is preferably present in the photosensitive layer in an amount ranging from approximately 2% to 30% based on the weight of the solid in the layer. A more preferred range is from approximately 6% to 20%.

In the practice of the present invention, the colorant component is preferably present in the photosensitive layer in an amount ranging from approximately 10% to 50% based on the weight of the solids in the layer. A more preferred range is from approximately 15% to 35%.

In the practice of the present invention, the binder component is preferably present in the photosensitive layer in an amount ranging from approximately 10% to 75% based on the weight of the solids in the layer. A more preferred range is from approximately 20% to 50%.

The adhesive layer is next applied to the photosensitive layer. Its purpose is to aid in the transfer of the coating composite and to protect the integrity of underlying, previous formed images during dry development of subsequent layer(s). The application of the adhesive may be accomplished in several different ways. For example, some adhesives may be coated on top of the photosensitive layer out of organic solvents which do not have any solubilizing or deleterious effect on the photosensitive layer. Such solvents can include cyclohexane, n-heptane, and n-hexane. Other adhesives may be coated out of water mixtures. Acrylic copolymers with high acid numbers, such as Carboset 525 from B. F. Goodrich, can be coated out of ammonium hydroxide: water mixtures. Alternatively, some adhesives may be coated as aqueous emulsions. Examples of aqueous emulsions include vinyl acetate copolymers such aa Mowilith DM-6 and DM-22 from Hoechst AG, and Vinac XX-210 and 465 DEV from Air Products. Some adhesives may be applied by hot melt extrusion. Suitable adhesives for this method of application include the ethylene/vinyl acetate copolymers, such as Elvax 40-W and 150-W from Du Pont.

The adhesive layer is distinguishable from the adhesion promoted surface. The adhesive layer is defined for the purpose of this invention as a layer consisting of an adhesive which flows and wets both surfaces of the elements to which it adheres and fills in the gaps of their surfaces under suitable conditions. Adhesive layers are generally thicker than 1 um.

The preferred method for applying the adhesive to the photosensitive layer is by laminating the two together under elevated pressure and/or temperature. The adhesive is initially coated onto a temporary support. The dried adhesive may then be transferred directly to the photosensitive layer. The temporary support is removed, and then the adhesive with the photosensitive layer and support is laminated to a receiver base. Alternatively, the dried adhesive may be laminated to a receiver base. The temporary support is removed, and the photosensitive layer with support is laminated to the adhesive on the receiver base.

Acrylic polymers and copolymers are preferred for the lamination method for applying the adhesive to the photosensitive layer. Vinyl acetate polymers and copolymers are more preferred for this lamination method. Polyvinyl acetates are available from Hoechst AG as Mowilith. These resins have a average molecular weight between 35,000 and 2,000,000. They have a softening temperature between 80° C. and 180° C. In the preferred embodiment, the polyvinyl acetate is present in the adhesive layer in an amount of greater than approximately 50 percent by weight. The adhesive resin should have a softening temperature in the range of approximately 40° C. to 200° C., more preferably 60° C. to 120° C. The layer may optionally contain such other desired components as UV absorbers, antistatic compositions, optical brighteners, and plasticizers. Suitable plasticizers include phthalates, nonexclusively including dibutyl phthalate, butyl benzyl phthalate, and dimethyl phthalate. Polymeric plasticizers, such as Resoflex R-296 available from Cambridge Industries, may also be used. The plasticizer may be present in the adhesive layer in an amount of up to approximately 30 percent by weight.

In the preferred embodiment, the dry adhesive layer has a coating weight range between approximately 2 and 30 g/m². The more preferred coating weight is between approximately 4 and 15 g/m². The thickness of the adhesive may be adjusted to regulate the apparent dot size of the final proof.

Receiver bases may comprise virtually any material which can withstand the laminating and dry development processes. White plastic sheets, such as adhesion promoted, filled polyethylene terephthalate Melinex 3020 from ICI, are useful for this purpose. Plastic coated paper sheets, such as polyethylene coated paper from Schoeller, may also be used. Other bases may include wood, glass, metal, and the like.

Lamination may be conducted by putting the two materials in contact and then introducing the materials into the nip of a pair of heated laminating rollers under suitable pressure. Suitable laminating temperatures usually range from approximately 60° C. to 120° C., preferably from 70° C. to 100° C.

The photosensitive layer is exposed by means well known in the art either before or after the adhesive layer is applied to the photosensitive layer. Exposure is preferably after the adhesive is applied to the photosensitive layer, and more preferably after the adhesive and photosensitive layers have been laminated to the receiver base. Such exposure may be conducted by exposure to actinic radiation from a light source through a conventional halftone positive color separation under vacuum frame conditions. Mercury vapor discharge lamps are preferred over metal halide lamps. Other radiation sources, such as carbon arc, pulsed xenon, and lasers, may also be used. Light absorbing filters may be used to reduce light scattering in the materials.

After lamination of the adhesive layer with the photosensitive layer and its support to the receiver base and after exposure of the photosensitive layer, the photosensitive layer is dry developed by stripping the support from the receiver base at room temperature with a steady, continuous motion. No devices are necessary to hold down the receiver base during stripping because only moderate manual peeling forces are needed to separate the materials. The preferred peel angle relative to the peel direction is greater than 90°. The delamination leaves the photoexposed areas on the support and the nonexposed areas on the adhesive layer. The adhesive layer typically remains with the receiver base. Thus, a positive image with the adhesive remains on the receiver base.

Another photosensitive layer is laminated via another adhesive to the first image on the receiver base. The second photosensitive layer has preferably a different color than the first and is exposed through the appropriate color separation. After lamination to the receiver and exposure, the support of the second photosensitive layer is removed as was done with the first support. The second positive image with its adhesive remains with the first image. A third and a fourth image may be added in a manner similar to that used to produce the second image. In the usual case, four colored layers are employed to produce a full color reproduction of a desired image. These four colors are cyan, magenta, yellow, and black.

A matte finish of the final image may be obtained by embossing the shiny, top surface of the image with a matte material, such as Melinex 377 from ICI. This is done by laminating together the final image and matte material. The matte material is then generally removed after lamination. The advantage of this method is that the finish of the final proof can be determined by careful selection of the matting material.

The final four color proof may be given a uniform, blanket exposure to photoharden the nonexposed, colored areas on the receiver base. A protective layer may also be laminated on top of the last dry developed layer.

The following nonlimiting examples serve to illustrate the invention.

EXAMPLE 1

The formulations for the photosensitive layers include the following ingredients in parts by weight, as indicated.

|  | Cyan | Yellow | Magenta | Black |
| --- | --- | --- | --- | --- |
| Tetrahydrofuran | 200 | 200 | 200 | 200 |
| 4-Hydroxy-4-methyl-2-pentanone | 150 | 150 | 150 | 150 |
| 1-Methoxy-2-propanol | 444 | 465 | 489 | 490 |
| gamma-Butyrolactone | 44 | 65 | 89 | 90 |
| Formvar 12/85 | 6 | 13 | 18 | 9 |
| Di-pentaerythritol monohydroxy pentaacrylate | 8 | 12 | 8 | 12 |

-continued

|  | Cyan | Yellow | Magenta | Black |
|---|---|---|---|---|
| 2,3-di(4-methoxyphenyl) quinoxaline | 4 | 4 | 4 | 4 |
| Hostaperm B2G | 7 | — | — | — |
| Permanent Yellow GR | — | 7 | — | — |
| Permanent Red FBB | — | — | 12 | — |
| Printex 25 | — | — | — | 11 |

The pigments are introduced into the above solutions as dispersions. They are dispersed with some of the Formvar binder in a 1:1 solvent mixture of 1-methoxy-2-propanol:gamma-butyrolactone. They are ground to the proper particle size for the correct transparency. The median diameter is less than 0.2 um. For each color, the ingredients are thoroughly mixed together and coated onto the adhesion promoted surface of a 63 um thick sheet of Melinex 528. This transparent polyethylene terephthalate film has an antistat treatment on the side opposite to the adhesion promoted side. This film base is commercially available from ICI. The coatings are dried at 93° C. to give optical densities of 1.3, 0.9, 1.3, and 1.6 for cyan, yellow, magenta, and black, respectively.

The formulation for the adhesive layer includes the following ingredients in parts by weight, as indicated.

| n-Butyl acetate | 78 |
|---|---|
| Resoflex R-96 | 1 |
| Mowilith 30 | 21 |

The adhesive ingredients are thoroughly mixed and coated onto the nontreated side of four sheets of 67 um thick Hostaphan 4756, which is a polyethylene terephtalate film with an antistat treatment on the other side. This film base is available from Hoechst Celanese. The coating is dried at 93° C. to a coating weight of 12 g/m².

The adhesive layer is applied to the cyan photosensitive layer by laminating the two materials together at 85° C. The temporary support for the adhesive is removed, leaving the adhesive layer on the photosensitive layer. Next, the photosensitive composite is laminated via the adhesive layer to a receiver base, in particular, a 145 um thick sheet of Melinex 3020. The photosensitive layer of the transferred composite is then image-wise exposed to actinic light through a cyan positive color separation and through the transparent support. After the exposure, the transparent support is removed from the receiver base, thereby removing the image-wise exposed portions with the support while leaving the adhesive layer and the image-wise nonexposed portions of the cyan photosensitive layer on the white receiver base.

Another adhesive layer is applied to the magenta photosensitive layer and its temporary support is removed from the photosensitive composite. Next, the composite is laminated on top of the first, cyan image and then image-wise exposed for an exposure duration equal to that for the cyan photosensitive layer. After the exposure, the support is removed, revealing the magenta image on top of the cyan image. This method is repeated for the yellow photosensitive layer and then for the black photosensitive layer. A full, four color reproduction is produced which gives an accurate representation of the original from which the separations are prepared. The circular resolving power for equal lines and spaces using these photosensitive layers is 15 um. The dot reproduction range is 2% to 98% with a 60 line/cm screen.

EXAMPLE 2

The formulations in Example 1 are used in this example. However in this case, the solutions for the photosensitive layers are coated onto 75 um thick sheets of Melinex 505, which is an adhesion promoted, transparent polyethylene terephthalate film commercially available from ICI. The solution for the adhesive layer is coated onto 75 um thick sheets of Melinex 516, which is a slip treated polyethylene terephthalate film from ICI. The adhesive layer is laminated to a 145 um thick receiver base of Melinex 3020. The temporary support for the adhesive is manually peeled off, leaving the adhesive layer on the white receiver base. Next, the cyan photosensitive layer with its support is brought in contact with the transferred adhesive layer. The two materials are thus laminated together at 85° C. The photosensitive layer is then image-wise exposed to actinic light through a cyan positive color separation and through the support. The cyan photosensitive layer is subsequently dry developed by the removal of the support from the receiver base.

Another adhesive layer is laminated on top of the first, cyan image. The temporary support for the adhesive is removed. Next, the magenta photosensitive layer with its support is laminated to the second adhesive. After forming the photosensitive composite, the magenta photosensitive layer is image-wise exposed. The magenta image is formed by peel development like the cyan image. This is repeated for the yellow photosensitive layer and then for the black photosensitive layer. This method produces a full, four color reproduction.

EXAMPLE 3

The formulations for the photosensitive layers in Example 1 are used in this example. However, the formulation for the adhesive layer includes the following ingredients in parts by weight, as indicated.

| n-butyl acetate | 85 |
|---|---|
| Mowilith 60 | 15 |

The photosensitive solutions are coated onto Melinex 505 and the adhesive solution is coated onto Melinex 516.

The adhesive layer is transferred to the cyan photosensitive layer, which is then image-wise exposed. The exposed photosensitive article with its latent image is then laminated to polyethylene coated paper. Next, the cyan photosensitive layer is peel developed.

Another adhesive layer is transferred to the magenta photosensitive layer. This composite is then exposed, laminated to the first, cyan image, and subsequently peel developed. The yellow and black photosensitive layers are likewise processed to produce a four color proof.

EXAMPLE 4

The formulations for the photosensitive layers include the following ingredients in parts by weight, as indicated.

|  | Yellow | Magenta |
|---|---|---|
| Tetrahydrofuran | 200 | 200 |

-continued

|  | Yellow | Magenta |
| --- | --- | --- |
| 4-Hydroxy-4-methyl-2-pentanone | 150 | 150 |
| 1-Methoxy-2-propanol | 444 | 465 |
| gamma-Butyrolactone | 44 | 65 |
| Formvar 7/95 | 5 | 9 |
| Di-pentaerythritol monohydroxy pentaacrylate | 12 | 8 |
| 2,3-di(4-methoxyphenyl)quinoxaline | 4 | 4 |
| Permanent Yellow GR | 7 | — |
| Permanent Red FBB | — | 12 |

The formulation for the adhesive is the same as that in Example 1. The photosensitive solutions are coated onto Melinex 505 and the adhesive solution is coated onto Melinex 516.

Adhesive layers are transferred to the yellow and magenta photosensitive layers. The magenta photosensitive composite is first transferred to Melinex 3020. This composite is then image-wise exposed and dry developed. Next, the yellow photosensitive composite is laminated to the magenta image. This is then image-wise exposed and dry processed to produce a two color progressive proof.

EXAMPLE 5

The formulations in Example 1 are used in this example. The ingredients for the photosensitive layer are thoroughly mixed and coated onto the adhesion promoted surface of 75 um thick sheets of Melinex 505 to give optical densities of 1.3, 0.9, 1.3, and 1.6 for cyan, yellow, magenta, and black, respectively.

The adhesive ingredients for the adhesive layer are thoroughly mixed and coated onto the slip treated surface of 75 um thick sheets of Melinex 516 to a dry coating thickness of 10 um. The adhesive layers are transferred to the four different photosensitive layers. The Melinex 516 sheets are removed, providing composites with the photosensitive layer between the adhesive layer and the Melinex 505. The magenta photosensitive composite is first transferred to a 145 um thick sheet of Melinex 3020. This composite is then image-wise exposed and dry developed. Next, the yellow photosensitive composite is laminated to the magenta image. This is then exposed and processed. The black composite and then the cyan composite are exposed and processed in a like manner. A full, four color reproduction is produced which gives an accurate representation of the original from which the separations were prepared. The circular resolving power for equal lines and spaces using these photosensitive layers is 15 um. The dot reproduction range is 2 to 98% with a 60 line/cm screen.

COMPARATIVE EXAMPLE A

The materials in this comparative example are similar to those in Example 5, except that the transparent support for this comparative example is a 75 um thick sheet of Melinex 516. This transparent polyethylene terephthalate support does not have an adhesion promoted surface. The chemical formulations and processing are the same as those used in Example 5. Optimum exposure for the comparison photosensitive composites is four times that used in Example 5.

A four color reproduction which is produced with the comparative materials is inferior to that made in Example 5. The circular resolving power is less, at 25 um. The dot reproduction range is narrower, at 5 to 90% with a 60 line/cm screen.

COMPARATIVE EXAMPLE B

The materials in this comparative example are similar to those in Comparative Example A, except that an additional adhesive layer is between the photosensitive layer and the transparent support. Thus the composites consist of, in the following order, a transparent support/additional adhesive layer/photosensitive layer/adhesive layer. The additional layer has the same thickness and chemical composition as the regular layer in Comparative Example A. The processing is the same as that used for Comparative Example A.

A four color reproduction which is produced with the materials from this comparative example is unacceptable due to residual colorants in the nonimage areas. This background stain is due to separation between the transparent support and the additional adhesive layer during peel development. In Example 5 and Comparative Example A, the colored photosensitive layers separate from the transparent supports in the nonexposed areas and from the adhesive layers in the exposed areas.

EXAMPLE 6

The formulations for the photosensitive layers include the following ingredients in parts by weight, as indicated.

|  | Cyan | Yellow | Magenta | Black |
| --- | --- | --- | --- | --- |
| Tetrahydrofuran | 200 | 200 | 200 | 200 |
| 4-Hydroxy-4-methyl-2-pentanone | 150 | 150 | 150 | 150 |
| 1-Methoxy-2-propanol | 444 | 465 | 489 | 490 |
| gamma-Butyrolactone | 44 | 65 | 89 | 90 |
| Formvar 12/85 | 5 | 9 | 10 | 9 |
| Di-pentaerythritol monohydroxy pentaacrylate | 8 | 12 | 8 | 12 |
| 4,4-Bis(dimethylamino)benzophenone | 2 | 2 | 2 | 2 |
| 2-Mercaptobenzothiazole | 2 | 2 | 2 | 2 |
| Bis(2,4,5-triphenyl)imidazole | 4 | 4 | 4 | 4 |
| Hostaperm B2G | 7 | — | — | — |
| Permanent Yellow GR | — | 7 | — | — |
| Permanent Red FBB | — | — | 12 | — |
| Printex 25 | — | — | — | 11 |

The formulation for the adhesive is the same as that in Example 1. The photosensitive solutions are coated onto Melinex 505 and the adhesive solution is coated onto sheets of Melinex 516.

The adhesive layers are transferred to the cyan, yellow, magenta, and black photosensitive layers. The cyan photosensitive composite is first transferred to Melinex 3020 via the adhesive layer. This photosensitive composite is then image-wise exposed and dry developed. Next, the magenta photosensitive composite is laminated to the cyan image. This is then exposed and processed. The yellow composite and then the black composite are exposed and processed in a like manner.

EXAMPLE 7

The photosensitive formulations in Example 6 are used in this example. The photosensitive solutions are coated onto the adhesion promoted side of four sheets of Melinex 528. The adhesive formulation in Example 3 is used in this example. The adhesive ingredients are thoroughly mixed and coated onto four sheets of Melinex 516 to a dry coating thickness of 10 um. As in Example 6, the adhesive layers are transferred to the colored photosensitive layers. The composites are then sequentially transferred to a sheet of Melinex 3020, image-wise exposed, and dry developed.

A full, four color reproduction is produced which gives an accurate representation of the original from which the separations were prepared. The circular resolving power for equal lines and spaces using these photosensitive layers is 15 um. The dot reproduction range is 2 to 98% with a 60 line/cm screen.

COMPARATIVE EXAMPLE C

The materials in this comparative example are similar to those in Example 7, except that the photosensitive ingredients are coated onto the antistat side of the Melinex 528 sheets, instead of the adhesion promoted side of the sheets. The chemical formulations and processing are the same as those used in Example 7.

A four color reproduction which is produced with the materials from this comparative example is unacceptable due to residual colorants in the nonimage areas. This background stain is due to separation between the antistat side of the transparent support and the colored photosensitive layer in the exposed and nonexposed areas during peel development. In Example 7, the colored photosensitive layer separates from the adhesion promoted surface of the film in the nonexposed areas and from the adhesive layer in the exposed areas.

What is claimed is:

1. A photosensitive element which comprises, in order:
   (A) a transparent support having an adhesion promoted surface; and
   (B) a single photosensitive composition layer directly on said adhesion promoted surface which photosensitive layer comprises an organic binding resin, a colorant, a photoinitiator, and a free radical polymerizable acrylate or methacrylate component having at least two ethylenically unsaturated groups, wherein said binding resin is present in sufficient amount to bind the composition components into a uniform film, and wherein said colorant is present in sufficient amount to uniformly color the composition, and wherein said photoinitiator is present in sufficient amount to initiate the free radical polymerization of said polymerizable component upon exposure to sufficient actinic radiation, and wherein said polymerizable component is present in sufficient amount to provide image differentiation when the composition is image-wise exposed to actinic radiation; and
   (C) an adhesive layer directly adhered to said colored, photosensitive layer, which adhesive layer comprises a thermoplastic resin which has a $T_g$ in the range of from about 25° C. to about 100° C., said photosensitive element having the capability wherein upon either
      (i) laminating a receiver base to said adhesive layer laminated at elevated temperature and pressure; and then image-wise exposing said photosensitive composition through the transparent support to actinic radiation; or
      (ii) image-wise exposing said photosensitive composition to actinic radiation; and then laminating a receiver base to said adhesive layer at elevated temperature and pressure; and thereafter
   peeling apart said support and said receiver base, the adhesive layer and the image-wise nonexposed portions of the colored, photosensitive composition are thereby transferred to the receiver base while the image-wise exposed portions remain on the adhesion promoted surface of the support.

2. The element of claim 1 wherein said transparent support comprises polyethylene terephthalate.

3. The element of claim 1 wherein said adhesion promoted surface comprises a surface coating of a crosslinked polymer or copolymer of acrylic acid or methacrylic acid or their esters.

4. The element of claim 1 wherein said photosensitive composition comprises one or more monomers selected from the group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerythritol triacrylate, bisphenol A ethoxylate dimethacrylate, trimethylolpropane ethoxylate triacrylate, and trimethylolpropane propoxylate triacrylate.

5. The element of claim 1 wherein said photosensitive composition comprises one or more photoinitiators selected from the group consisting of 2,3-di(4-methoxyphenyl)quinoxaline, 9-phenylacridine, bis(2,4,5-triphenyl)imidazole, and their derivatives.

6. The element of claim 1 wherein said photosensitive composition comprises one or more colorants selected from the group consisting of dyes and pigments.

7. The element of claim 1 wherein said photosensitive composition comprises one or more binding resins selected from the group consisting of styrene/maleic anhydride copolymers and their half esters; acrylic polymers and copolymers; polyamides; polyvinyl pyrrolidones; cellulosic resins; phenolic resins; and polyvinyl acetals.

8. The element of claim 7 wherein said polyvinyl acetal is a polyvinyl formal polymer or copolymer containing vinyl formal.

9. The element of claim 1 wherein said photosensitive composition further comprises one or more ingredients selected from the group consisting of spectral sensitizers, thermal polymerization inhibitors, plasticizers, oligomers, surfactants, inert fillers, antihalation agents, hydrogen atom donors, photoactivators, and optical brightening agents.

10. The element of claim 1 wherein said adhesive layer comprises a vinyl acetate polymer or copolymer containing vinyl acetate.

11. The element of claim 1 wherein said adhesive layer further comprises one or more ingredients selected from the group consisting of UV absorbers, antistatic composition, optical brighteners, and plasticizers.

12. The photosensitive element of claim 1 wherein said transparent support comprises polyethylene terephthalate; and said adhesion promoted surface comprises a crosslinked polymer or copolymer of acrylic acid or methacrylic acid or their esters; and said photosensitive composition comprises one or more acrylate or methacrylate components selected from the group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane triacrylate, trimethylol propane trimethacrylate, di-pentaerythritol monohydroxypentaacrylate, pentaerythritol triacrylate, bisphenol A ethoxylate dimethacrylate, trimethylolpropane ethoxylate triacrylate, and trimethylolpropane propoxylate triacrylate; and said photosensitive composition comprises one or more photoinitiators selected from the group consisting of 2,3-di(4-methoxyphenyl)quinoxaline, 9-phenylacridine, bis(2,4,5-triphenyl)imidazole, and their derivatives; and said photosensitive composition comprises one or more pigments; and said photosensitive composition comprises one or more binding resins selected from the group consisting of vinyl acetal containing polymers and copolymers; and said adhesive layer comprises polyvinyl acetate.

13. A photosensitive element which comprises, in order:

(A) a transparent support; and (B) a single photosensitive composition layer directly on one surface of said support, which photosensitive layer comprises an organic binding resin, a colorant, a photoinitiator, and a free radical polymerizable acrylate or methacrylate component having at least two ethylenically unsaturated groups, wherein said binding resin is present in sufficient amount to bind the composition components into a unifrom film, and wherein said colorant is present in sufficient amount to uniformly color the composition, and wherein said photoinitiator is present in sufficient amount to initiate the free radical polymerization of said polymerizable component upon exposure to sufficient actinic radiation, and wherein said polymerizable component is present in sufficient amount to provide image differentiation when the composition is image-wise exposed to actinic radiation; and (c) an adhesive layer directly adhered to said colored, photosensitive layer, which adhesive layer comrises a thermoplastic resin which has a $T_g$ in the range of from about 25° C. to about 100° C., said photosensitive element having the cap0ability wherein upon either (i) laminating a receiver base to said adhesive layer laminated at elevated temperature and pressure; and then image-wise exposing said photosensitive composition through the transparent support to actinic radiation; or (ii) image-wise exposing said photosensitive composition to actinic radiation; and then laminating a receiver base to said adhesive layer at elevated temperature and pressure; and thereafter peeling apart said support and said receiver base, the adhesive layer and the image-wise nonexposed portions of the colored, photosensitive composition are thereby transferred to the receiver base while the image-wise exposed portions remain on the surface of the support.

14. The element of claim 13 wherein said transparent support comprises polyethylene terephthalate.

15. The element of claim 13 wherein said photosensitive composition comprises one or more monomers selected from the group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethyl propane triacrylate, trimethylol propane trimethacrylate, di-pentaerythritol monohydroxypentaacrylate, pentaerythritol triacrylate, bisphenol A ethoxylate dimethacrylate, trimethylolpropane ethoxylate triacrylate, and trimethylolpropane propoxylate triacrylate.

16. The element of claim 13 wherein said photosensitive composition comprises one or more photoinitiators selected from the group consisting of 2,3-di(4-methoxyphenyl)quinoxaline, 9-phenylacridine, bis(2,4,5-triphenyl)imidazole, and their derivatives.

17. The element of claim 13 wherein said photosensitive composition comprises one or more colorants selected from the group consisting of dyes and pigments.

18. The element of claim 13 wherein said photosensitive composition comprises one or more binding resins selected from the group consisting of styrene/maleic anhydride copolymers and their half esters; acrylic polymers and copolymers; polyamides; polyvinyl pyrrolidones; cellulosic resins; phenolic resins; and polyvinyl acetals.

19. The element of claim 18 wherein said polyvinyl acetal is a polyvinyl formal polymer or copolymer containing vinyl formal.

20. The element of claim 13 wherein said photosensitive composition further comprises one or more ingredients selected from the group consisting of spectral sensitizers, thermal polymerization inhibitors, plasticizers, oligomers, surfactants, inert fillers, antihalation agents, hydrogen atom donors, photoactivators, and optical brightening agents.

21. The element of claim 13 wherein said adhesive layer comprises a vinyl acetate polymer or copolymer containing vinyl acetate.

22. The element of claim 21 wherein the vinyl acetate polymer or copolymer containing vinyl acetate is present in the said adhesive layer in an amount of at least about 50% by weight of said adhesive layer.

23. The element of claim 13 wherein said adhesive layer further comprises one or more ingredients selected from the group consisting of UV absorbers, antistatic composition, optical brighteners, and plasticizers.

24. The element of claim 13 wherein said transparent support comprises polyethylene terephthalate; and said photosensitive composition comprises one or more acrylate or methacrylate components selected from the group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane triacrylate, trimethylol propane trimethacrylate, di-pentaerythritol monohydroxypentaacrylate, pentaerythritol triacrylate, bisphenol A ethoxylate dimethacrylate, trimethylolpropane ethoxylate triacrylate, and trimethylolpropane propoxylate triacrylate; and said photosensitive composition comprises one or more photoinitiators selected from the group consisting of 2,3-di(4-methoxyphenyl)quinoxaline, 9-phenylacridine, bis(2,4,5-triphenyl)imidazole, and their derivatives; and said photosensitive composition comprises one or more pigments; and said photosensitive composition comprises one or more binding resins selected from the group consisting of vinyl acetal containing polymers and copolymers; and said adhesive layer comprises polyvinyl acetate.

25. The element of claim 13 wherein the coating weight of said photosensitive composition ranges from about 0.1 g/m² to 5 g/m².

26. The element of claim 13 wherein the acrylate or methacrylate component is present in said photosensitive layer in an amount ranging from about 10% to about 60% by weight of the photosensitive composition.

27. The element of claim 13 wherein the photoinitiator component is present in said photosensitive layer in an amount ranging from about 2% to about 30% by weight of the photosensitive composition.

28. The element of claim 13 wherein the colorant component is present in said photosensitive layer in an amount ranging from about 10% to about 50% by weight of the photosensitive composition.

29. The element of claim 13 wherein the binder component is present in said photosensitive layer in amount ranging from about 10% to about 75% by weight of the photosensitive composition.

30. The element of claim 13 wherein said adhesive layer comprises one or more thermoplastic polymers having a softening temperature in the range of about 40° C. to about 200° C.

31. The element of claim 13 wherein the coating weight of the said adhesive layer ranges from about 2 g/m² to about 30 g/m².

* * * * *